United States Patent
Zhang et al.

(10) Patent No.: US 11,177,153 B2
(45) Date of Patent: Nov. 16, 2021

(54) METHOD OF DEBONDING WORK-CARRIER PAIR WITH THIN DEVICES

(71) Applicant: Chengdu ESWIN SiP Technology Co., Ltd., Chengdu (CN)

(72) Inventors: Chunbin Zhang, Fremont, CA (US); Xiaotian Zhou, Fremont, CA (US)

(73) Assignee: Chengdu ESWIN SiP Technology Co., Ltd., Chengdu (CN)

( * ) Notice: Subject to any disclaimer, the term of this patent is extended or adjusted under 35 U.S.C. 154(b) by 39 days.

(21) Appl. No.: 15/964,576

(22) Filed: Apr. 27, 2018

(65) Prior Publication Data

US 2019/0295877 A1 Sep. 26, 2019

Related U.S. Application Data

(60) Provisional application No. 62/645,184, filed on Mar. 20, 2018.

(51) Int. Cl.
*B32B 43/00* (2006.01)
*H01L 21/683* (2006.01)
*B32B 38/10* (2006.01)

(52) U.S. Cl.
CPC .......... *H01L 21/6835* (2013.01); *B32B 38/10* (2013.01); *B32B 43/006* (2013.01); *H01L 2221/68381* (2013.01); *Y10T 156/1111* (2015.01); *Y10T 156/1158* (2015.01); *Y10T 156/1184* (2015.01); *Y10T 156/1917* (2015.01); *Y10T 156/1967* (2015.01)

(58) Field of Classification Search
CPC .. B32B 38/10; B32B 43/006; Y10T 156/1111; Y10T 156/1184; Y10T 156/1158; Y10T 156/1917; Y10T 156/1967
USPC .......................... 156/703, 717, 712, 762, 753
See application file for complete search history.

(56) References Cited

U.S. PATENT DOCUMENTS

| | | |
|---|---|---|
| 6,821,376 B1 | 11/2004 | Rayssac |
| 8,950,459 B2 * | 2/2015 | George ............. H01L 21/67282 156/716 |
| 9,254,636 B2 | 2/2016 | Price |

(Continued)

FOREIGN PATENT DOCUMENTS

WO    2016128079    8/2016

*Primary Examiner* — Philip C Tucker
*Assistant Examiner* — Nickolas R Harm
(74) *Attorney, Agent, or Firm* — Scully Scott Murphy & Presser

(57) ABSTRACT

Disclosed is a thin subject assisted debonding method for separating temporarily bonded workpiece-carrier pair. The thin subject can be a thin wire, or thin filament, or thin blade. The thin subject can be applied between the workpiece and carrier pair in association with laser debonding or mechanical debonding to provide well controlled and targeted wedging function to the delaminating temporary adhesive and its adjacent substrate to which it is separating from. The workpiece can be a semiconductor wafer that has been thinned and processed, and the carrier can be a semiconductor non-device wafer or any other rigid substrate such as a glass wafer or panel. The application of a thin subject between the workpiece and carrier during debonding provides the advantage of high throughput and low defect rate.

5 Claims, 11 Drawing Sheets

(56) References Cited

U.S. PATENT DOCUMENTS

| | | |
|---|---|---|
| 9,381,732 B2 | 7/2016 | Lindner |
| 2002/0029849 A1 | 3/2002 | Ohmi |
| 2003/0010445 A1 | 1/2003 | Yanagita et al. |
| 2003/0121601 A1 | 7/2003 | Tajima |
| 2007/0214649 A1 | 9/2007 | Hess |
| 2009/0183615 A1* | 7/2009 | Sampica ............... B26D 1/547 83/651.1 |
| 2010/0107834 A1 | 5/2010 | Lai |
| 2010/0133373 A1 | 6/2010 | Klabunde |
| 2011/0180218 A1* | 7/2011 | Ciliberti ............... G02F 1/1303 156/705 |
| 2012/0000613 A1 | 1/2012 | Thallner |
| 2012/0276818 A1 | 11/2012 | Cramer |
| 2014/0102270 A1* | 4/2014 | Teck ..................... B26D 3/28 83/13 |
| 2016/0095268 A1 | 3/2016 | Wang |
| 2016/0195968 A1* | 7/2016 | Zhan ..................... B26D 1/547 345/173 |
| 2017/0018450 A1 | 1/2017 | Tang |
| 2018/0040489 A1 | 2/2018 | Fehkuhrer |

\* cited by examiner

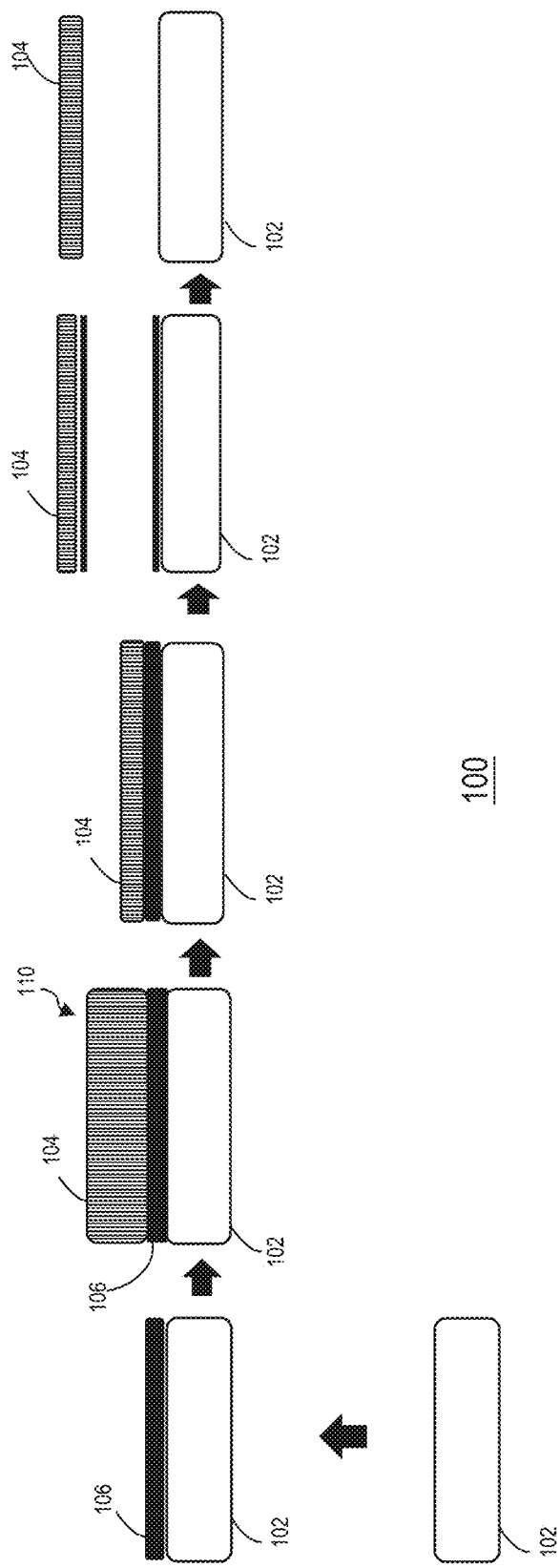

METHOD OF DEBONDING WORK-CARRIER PAIR WITH THIN DEVICES

RELATED APPLICATION

The present application claims priority to U.S. Provisional Application No. 62/645,184 filed Mar. 20, 2018, entitled "Thin Subject Assisted Debonding Method for Separating Temporary Adhesive Bonded Workpiece-Carrier" which is incorporated herein by reference in its entirety.

FIELD OF THE INVENTION

The present disclosure relates generally to electronic devices and, more particularly, to methods of packaging semiconductor devices.

BACKGROUND

In many applications, a workpiece needs to be thinned or processed with the support of a carrier to make the workpiece mechanically stable. The workpiece can be temporarily bonded to a support carrier using adhesives. At end of the application, the workpiece needs to be removed or debonded from the carrier, and cleaned of any residual adhesives. Widespread applications of smartphones, tablets, and portable consumer electronics are driving semiconductor packaging towards thinner, smaller and more integrated directions. For example, fan-out type wafer level packaging and 3D wafer packing such as 2.5D/3D TSV are two applications that require thin wafer handling by means of temporary wafer bonding. In semiconductor wafer thinning process, the workpiece is a semiconductor device wafer having thousands of integrated circuits thereon. In fan-out wafer level packaging, the device wafer can be epoxy compound molded with thousands of semiconductor devices thereon. The carrier wafer can be made of various type of rigid materials to provide required mechanical support to the device wafer during device wafer thinning and processing. After the intended wafer thinning and processing operations, the temporary adhesive bonded device wafer and the carrier need to be separated. This separation process is called debonding. The temporary wafer debonding process needs to have high throughput, low defect rate, and low cost to be suitable for volume production.

FIGS. 1A and 1B are schematics of temporary wafer bonding and debonding processes known to those of skill in the art. The temporary adhesive is usually a polymeric material, but could also optionally contain other additives. The temporary adhesive wafer bonding process includes coating the carrier wafer with a temporary adhesive. The device wafer (possibly after application of the protective layer) is shown facedown with the temporary adhesive-coated rigid carrier wafer under vacuum and pressure. The device wafer is then thinned and processed from the backside. The fully processed, ultra-thin wafer is then removed, or debonded, from the carrier after the backside processing has been completed. After debonding, the wafer and device wafers are cleaned.

Mechanical debonding and laser debonding are the two most commonly used debonding techniques currently in the market. In mechanical debonding, the adhesive may be peeled off at a certain angle from one side of the workpiece-carrier pair, e.g., carrier surface, together with another half of the pair, e.g., the device wafer. The mechanical debonding is very similar to how a pressure-sensitive tape is detached from its adhering substrate via peeling. In laser debonding, the adhesive can be made of two layers with the layer on the carrier side being laser abatable and is used as release layer. This means the release layer will lose adhesion to the carrier once irradiated with a laser beam, thus, resulting in the debonding of device wafer from the carrier. In laser debonding, the laser beam, of certain UV wavelengths is applied to the adhesive releasing layer thorough transparent rigid carrier. FIGS. 2 and 3 show the schematics of mechanical and lasering debonding methods as can be appreciated by one of skill in the art.

In practical applications, especially in semiconductor wafer leveling packaging and 3D/2.5D wafer packaging, a debonding method needs to provide low cost and high quality. These requirements demand that the debonding process in a wafer fab, needs to be of high throughput and of very low defect rate. In mechanical debonding, the adhesive peeling action puts high stress on the adhesive and device wafer and has high risk of localized device wafer damage due to high stress. With laser debonding method the laser can damage the adhesive and device wafer due to laser misfocus or nonuniformity in the release layer. Both mechanical and laser debonding could still have residual adhesive remaining and result in incomplete debonding or thinned wafer damage due to local high stress. All these factors make the mechanical and laser bonding unreliable during high volume production. Therefore, there exist a need to remedy the potential problems existing in the current mechanical and laser debonding methodology.

BRIEF SUMMARY

The embodiments of present invention provide effective solutions to problems existing in the mechanical and laser bonding methodologies. The embodiments of the present invention can enhance the process efficiency, simplify the procedure, provide high wafer throughput, and reduce or eliminate the defects such as device wafer breakage and internal device damage.

In one embodiment, a method of manufacturing a semiconductor device includes: providing a first substrate bonded to a second substrate having an adhesive material therebetween, where the first substrate includes at least one integrated circuit disposed thereon, and separating the first substrate from the second substrate by actuating an external device into direct physical contact with the adhesive layer without the use of any additional mechanical or electromagnetic forces.

In another embodiment, the providing step includes providing the first substrate including a device wafer workpiece, where the device wafer workpiece can be an optical lens, quartz, sapphire wafer, display glass, LED crystal, thin metal plate, thin membrane, thin film, silicon, polysilicon, silicon oxide, silicon-germanium, silicon nitride, gallium arsenide, gallium phosphide, alumina titanium carbide, silicon carbide, copper, aluminum, steel, gold, tungsten, tantalum, low-K dielectric, metal nitrides, metal alloys, silicide, and combinations thereof, and where the providing step includes the first substrate bonded to the second substrate, where the second substrate includes silicon, glass, quartz, sapphire, and combinations thereof.

In one embodiment, the method further includes: concomitant to the separating step, applying a mechanical force to the at least one of the first substrate and the second substrate in a substantially vertical orientation to facilitate separation of the first substrate from the second substrate. In another embodiment, the method further includes: exposing the first substrate and the second substrate to a chemical solvent further operable to dissolving the adhesive material. In another embodiment, the method further includes: concomitant to the separating step, applying an electromagnetic force to the at least one of the first substrate, the second substrate, and the adhesive layer to facilitate separation of the first substrate from the second substrate.

In one embodiment, the separating step includes actuating the external device in a reciprocating saw motion. In another embodiment, the separating step includes actuating the external device in the form of a blade or a wire, where the blade or the wire is made of at least one of ceramic, metal, metal composite, metal coated polymer, metal alloy, synthetic or natural polymer, or polymer composite. In some embodiments, the separating step includes actuating the external device in the form of a blade or a wire, where the blade or the wire has triangular, circular, oval, rectangular, or square cross-section profile transverse the wire or the blade. In other embodiments, the separating step includes actuating the external device in the form of a blade or a wire, where the blade or the wire has saw-tooth shaped cross-section profile along at least a portion of the wire or the blade.

In one embodiment, a method of manufacturing a semiconductor device includes: providing a first substrate bonded to a second substrate having an adhesive material therebetween, where the first substrate includes at least one integrated circuit disposed thereon; applying a mechanical force to the at least one of the first substrate and the second substrate in a substantially vertical orientation; and concomitant to the applying step, actuating an external device into direct physical contact with the adhesive layer along a substantially horizontal orientation to facilitate separation of the first substrate from the second substrate. In another embodiment, the method further includes: exposing the first substrate and the second substrate to a chemical solvent further operable to dissolving the adhesive material.

In some embodiments, the separating step includes actuating the external device in the form of a blade or a wire in a reciprocating saw motion, where the blade or the wire is made of at least one of ceramic, metal, metal composite, metal coated polymer, metal alloy, synthetic or natural polymer, or polymer composite. In other embodiments, the separating step includes actuating the external device in the form of a blade or a wire in a reciprocating saw motion, where the blade or the wire has triangular, circular, oval, rectangular, or square cross-section profile transverse the wire or the blade. In some embodiments, the separating step includes actuating the external device in the form of a blade or a wire in a reciprocating saw motion, wherein the blade or the wire has saw-tooth shaped cross-section profile along at least a portion of the wire or the blade.

In one embodiment, a method of manufacturing a semiconductor device includes: providing a first substrate bonded to a second substrate having an adhesive material therebetween, where the first substrate includes at least one integrated circuit disposed thereon; applying an electromagnetic force to the at least one of the first substrate, the second substrate, and the adhesive layer; and concomitant to the applying step, actuating an external device into direct physical contact with the adhesive layer along a substantially horizontal orientation to facilitate separation of the first substrate from the second substrate. In another embodiment, the method further includes: exposing the first substrate and the second substrate to a chemical solvent further operable to dissolving the adhesive material.

In some embodiments, the separating step includes actuating the external device in the form of a blade or a wire in a reciprocating saw motion, where the blade or the wire is made of at least one of ceramic, metal, metal composite, metal coated polymer, metal alloy, synthetic or natural polymer, or polymer composite. In other embodiments, the separating step includes actuating the external device in the form of a blade or a wire in a reciprocating saw motion, where the blade or the wire has triangular, circular, oval, rectangular, or square cross-section profile transverse the wire or the blade. In some embodiments, the separating step includes actuating the external device in the form of a blade or a wire in a reciprocating saw motion, wherein the blade or the wire has saw-tooth shaped cross-section profile along at least a portion of the wire or the blade.

According to embodiments of the present invention, a thin subject is implemented to apply wedging function (shear force along the surfaces of the two substrates, carrier and workpiece) after laser debonding in the case of laser debonding; during mechanical debonding in the case of mechanical debonding.

Aspects and embodiments of the invention will be described now with reference to the attached drawings.

BRIEF DESCRIPTION OF THE DRAWINGS

FIG. 1B is a cross-sectional process flow illustrating steps of prior art temporary wafer bonding and debonding process.

DETAILED DESCRIPTION

Disclosed are methods of separating a temporary adhesive bonded carrier-workpiece pair with the use of a thin subject in association with laser debonding or mechanical debonding. This method can be used for processing various workpieces of: different shapes, e.g., round, rectangle, and square, among others; different materials, e.g., silicon, gallium arsenide, sapphire, glass, and metal, among others; different thicknesses, e.g., thick or thin; and different applications, e.g., optical lens, semiconductors, displays-LCD, and solar, among others. In some embodiments, the methods may be useful for debonding temporarily adhesive bonded semiconductor wafers that are used in wafer level packaging and 3D semiconductor wafer packaging (2.5D/3D).

Figure 1A:
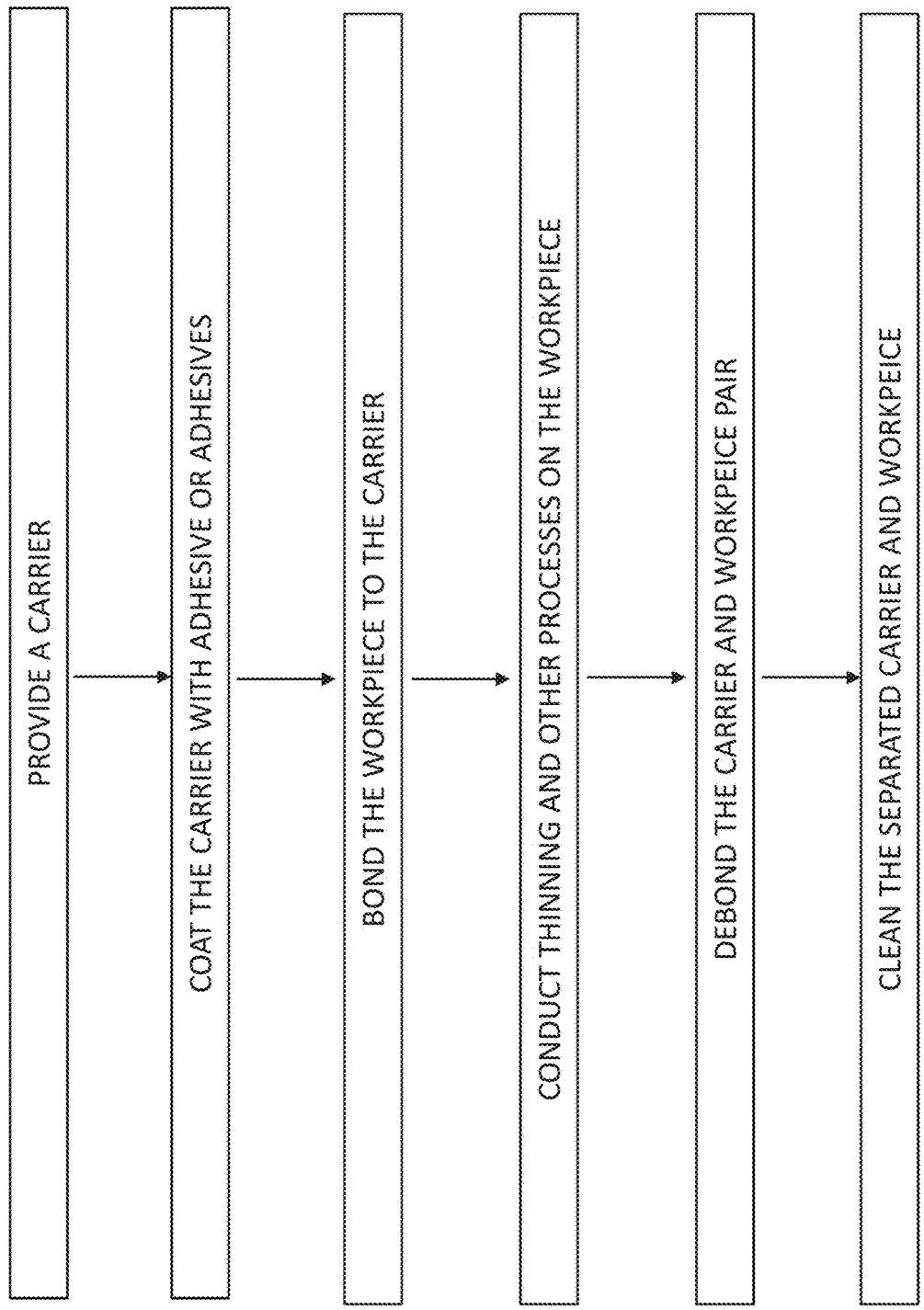
FIG. 1A is flow diagram illustrating steps of prior art temporary wafer bonding, processing, and debonding.

FIG. 1A is a flow diagram illustrating the steps of prior art temporary wafer bonding, processing, and debonding. As shown, a carrier can be provided, the carrier being coated with an adhesive material, and bonded to a workpiece. Additional processing such as thinning and other processes can be carried out on the workpiece. The carrier and the workpiece pair can subsequently be debonded and cleaned. FIG. 1A can be read in conjunction with the cross-sectional views shown in FIG. 1B for better understanding.

FIG. 1B shows a cross-sectional views of a temporary wafer bonding and debonding process flow 100 as can be appreciated by one of skill in the art. As shown, a carrier 102 can be provided. The carrier 102 can subsequently be coated with an adhesive material 106 and bonded to a workpiece 104 to form a temporary wafer bonding stack 110. The workpiece 104 may subsequently be thinned. The carrier 102 and the workpiece 104 may subsequently be debonded by known mechanical and/or laser debonding techniques, followed by cleaning of the substrates 102, 104 to remove any residual adhesive material 106.

Figure 2:
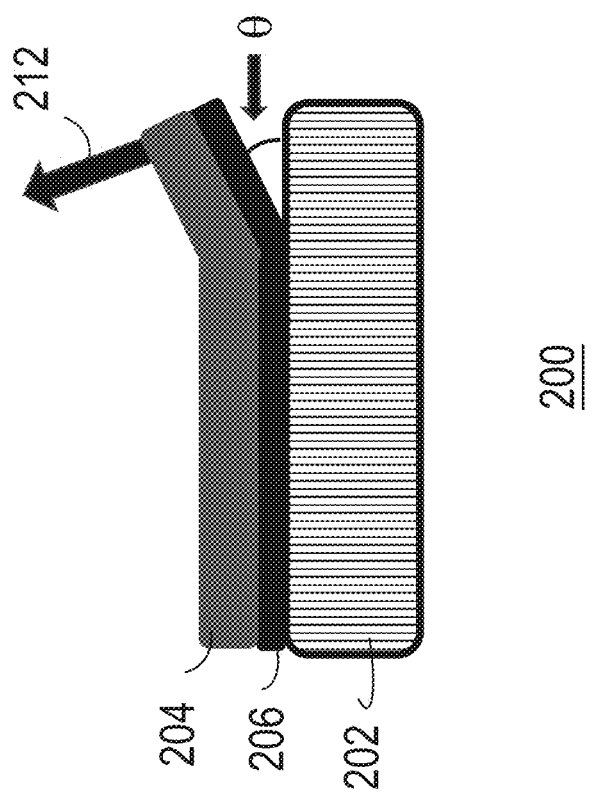
FIG. 2 is a prior art cross-sectional view of the schematics of mechanical debonding method.

FIG. 2 is a cross-sectional view of mechanical debonding 200 as can be appreciated by one of skill in the art. As shown, the carrier 202 is bonded to a workpiece 204 with an adhesive material 206. The workpiece 204 may subsequently be subjected to a peeling device 212 at an angle (θ) or in a substantially vertical direction to separate the workpiece 204 from the carrier 202 via mechanical forces.

Figure 3:
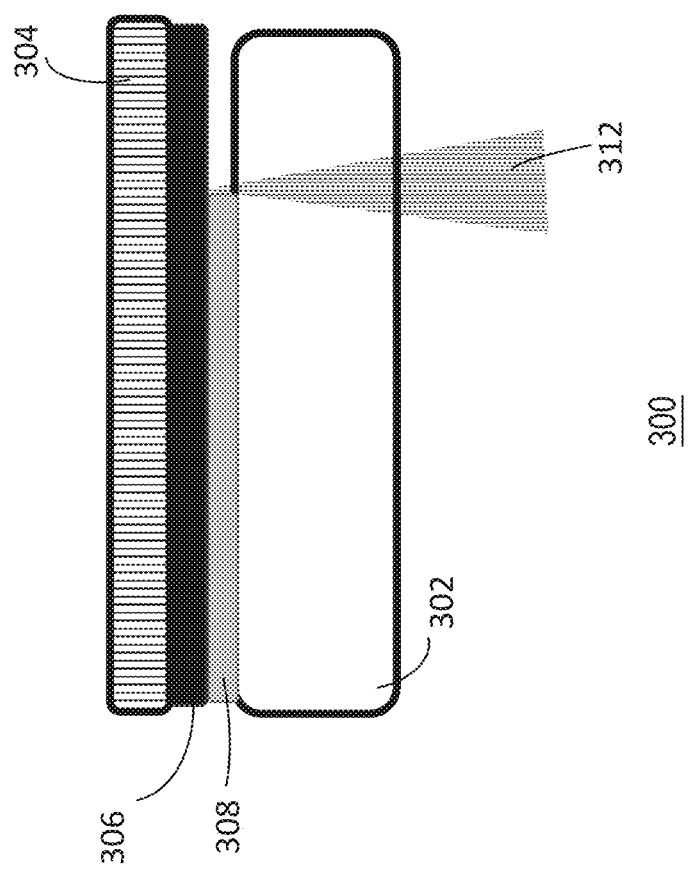
FIG. 3 is a prior art cross-sectional view of the schematics of lasering debonding method.

FIG. 3 is a cross-sectional view of a laser debonding 300 as can be appreciated by one of skill in the art. As shown, the carrier 302 is bonded to a workpiece 304 with an adhesive material 306 and optional release material 308. In some instances, the release material 308 may also be a laser decomposable adhesive. The workpiece 304 and the carrier 302 may subsequently be subjected to a laser device 312 to dissolve or decompose the release material 308. In other instances, the adhesive material 306 may be subjected to the laser device 312 to separate the workpiece 304 and the carrier 302.

Figure 4:
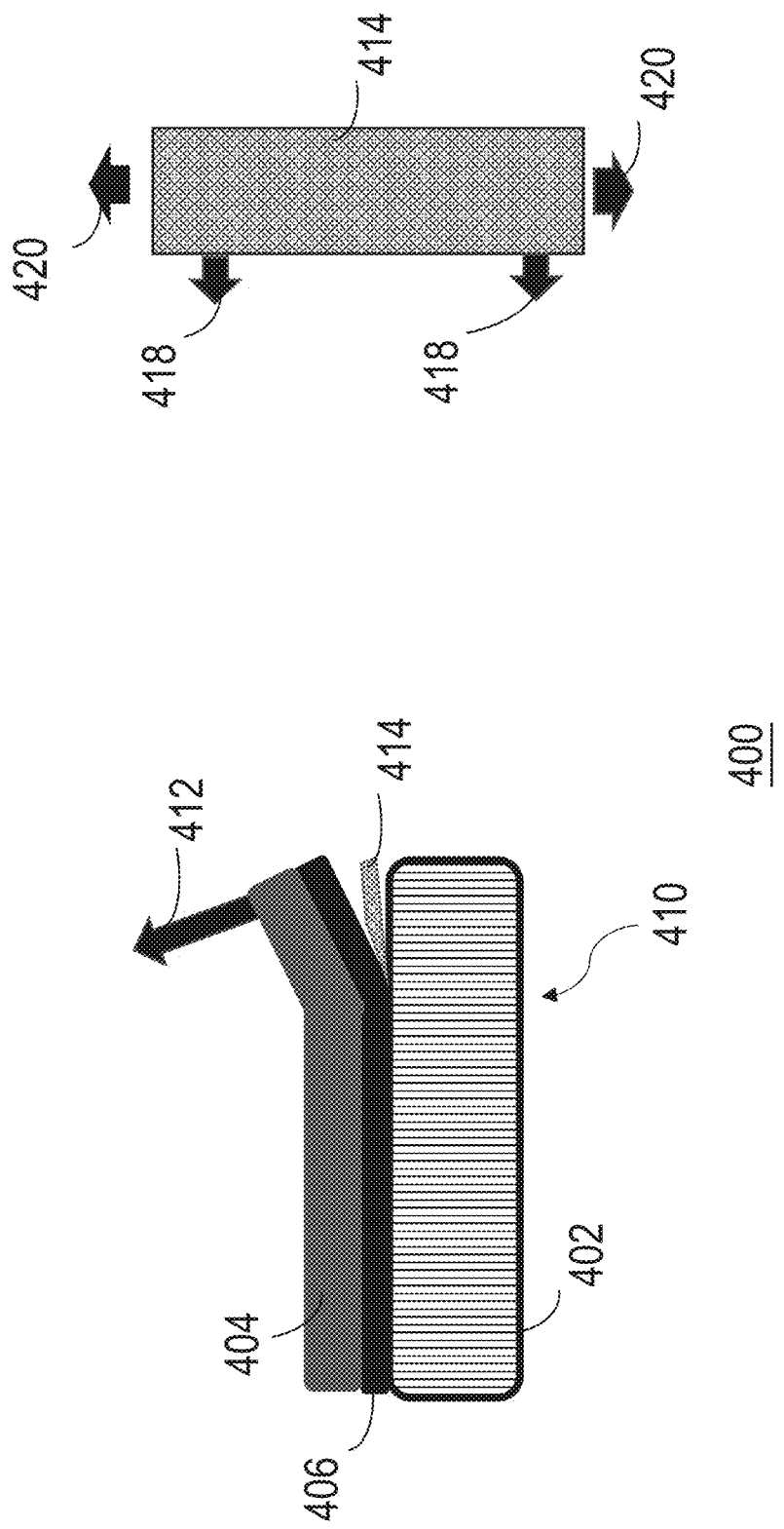
FIG. 4 shows cross-sectional and top views according to one embodiment of the disclosure.

FIG. 4 shows cross-sectional and top views, respectively, of a debonding technique 400 according to one embodiment of the present disclosure. As shown, the carrier 402 is bonded to a workpiece 404 with an adhesive material 406 to form a temporary bonding stack 410. In operation, an external component such as a thin subject 414 may be brought into direct physical contact with the adhesive material 406 to facilitate separation of the workpiece 404 from the carrier 402. The thin subject 414 can apply wedge force or shear force to the debonding interface between the adhesive material 406 and a substrate, whether it be the workpiece 404 or the carrier 402. Optionally, a pulling device 412 similar in operation to that shown in FIG. 2 may be incorporated to further facilitate the debonding process. As shown in the top view, the thin subject 414 may be moved across the temporary bonding stack 410 along X and Y directions as shown by the arrows 418 and 420, respectively. In some embodiments, the movements of the thin subject 414 may be in a reciprocating saw-like motion during its application.

Figure 5:
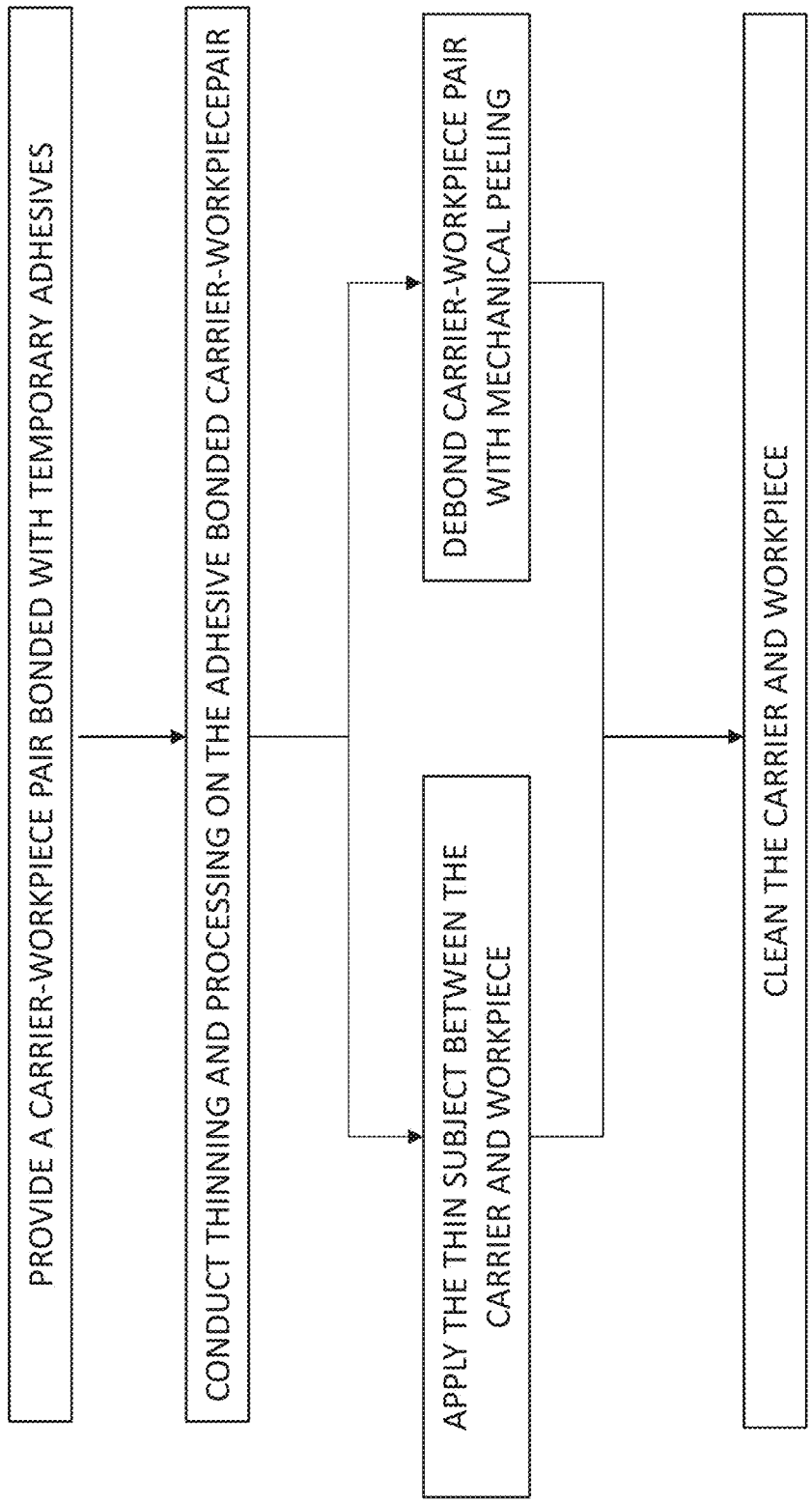
FIG. 5 is a flow diagram illustrating the processing steps in another embodiment of the disclosure using a thin device.

FIG. 5 is a flow diagram illustrating steps in one embodiment of using thin subject 414 to solve problems associated with the mechanical debonding method. In operation, the process starts with providing a carrier-workpiece pair with temporary adhesives 410. Optionally, the adhesive bonded carrier-workpiece pair can be thinned and processed. In one embodiment, the thin subject 414 can be applied between the carrier and the workpiece as shown in FIG. 4. Concomitant to the applying step of the thin subject 414, the carrier-workpiece can be debonded with mechanical peeling technique via a peeling device 412. In one embodiment, the debonding process can be carried out with the thin subject 414 by itself. In another embodiment, the debonding process can be carried out with the thin subject 414 in conjunction with known mechanical peeling techniques. In this embodiment, the two steps can be carried out concomitantly, in a reciprocating saw-like motion as discussed above, to further facilitate the debonding process. The carrier 402 and the workpiece 404 may subsequently be cleaned by known techniques to complete the debonding process.

In one embodiment, a method of manufacturing a semiconductor device includes: providing a first substrate bonded to a second substrate having an adhesive material therebetween, where the first substrate includes at least one integrated circuit disposed thereon, and separating the first substrate from the second substrate by actuating an external device into direct physical contact with the adhesive layer without the use of any additional mechanical or electromagnetic forces.

In another embodiment, the providing step includes providing the first substrate including a device wafer workpiece, where the device wafer workpiece can be an optical lens, quartz, sapphire wafer, display glass, LED crystal, thin metal plate, thin membrane, thin film, silicon, polysilicon, silicon oxide, silicon-germanium, silicon nitride, gallium arsenide, gallium phosphide, alumina titanium carbide, silicon carbide, copper, aluminum, steel, gold, tungsten, tantalum, low-K dielectric, metal nitrides, metal alloys, silicide, and combinations thereof, and where the providing step includes the first substrate bonded to the second substrate, where the second substrate includes silicon, glass, quartz, sapphire, and combinations thereof.

In one embodiment, the method further includes: concomitant to the separating step, applying a mechanical force to the at least one of the first substrate and the second substrate in a substantially vertical orientation to facilitate separation of the first substrate from the second substrate. In another embodiment, the method further includes: exposing the first substrate and the second substrate to a chemical solvent further operable to dissolving the adhesive material.

In another embodiment, the method further includes: concomitant to the separating step, applying an electromagnetic force to the at least one of the first substrate, the second substrate, and the adhesive layer to facilitate separation of the first substrate from the second substrate. This will become more apparent in subsequent discussion.

In one embodiment, the separating step includes actuating the external device in a reciprocating saw motion. In another embodiment, the separating step includes actuating the external device in the form of a blade or a wire, where the blade or the wire is made of at least one of ceramic, metal, metal composite, metal coated polymer, metal alloy, synthetic or natural polymer, or polymer composite. In some embodiments, the separating step includes actuating the external device in the form of a blade or a wire, where the blade or the wire has triangular, circular, oval, rectangular, or square cross-section profile transverse the wire or the blade. In other embodiments, the separating step includes actuating the external device in the form of a blade or a wire, where the blade or the wire has saw-tooth shaped cross-section profile along at least a portion of the wire or the blade. This will become more apparent in subsequent discussion.

In some embodiments, the debonding methods involve the introduction of a thin subject 414 as shown in FIG. 4, to solve the problems existing in mechanical and laser debonding illustrated by way of example, and not by way of limitation. FIGS. 4-5 schematically and generally show parts which are necessary in order to elucidate the disclosure. For simplicity and clarity of illustration, elements shown in the figure and discussed herein have not necessarily been drawn to scale. Well-known structures and devices are shown in simplified form in order to avoid unnecessarily obscuring the present disclosure. Other parts may be omitted or merely suggested.

FIGS. 4 and 5 schematically demonstrate the method of introducing a thin subject 414 to facilitate mechanical debonding by means of solving the problems inherently associated with mechanical debonding methodology. In mechanical debonding, the thin subject 414 can be applied right to the adhesive fracture locus and help to speed up the fracture propagation uniformly and eliminate the possibility of undetached adhesive existence. The insertion of the thin subject 414 can be applied anytime, but preferably at the start of mechanical debonding and in combination with the peeling or pulling process. In some embodiments, the thin subject 414 can be the initiator of the adhesive debonding at the edge.

Figure 6:
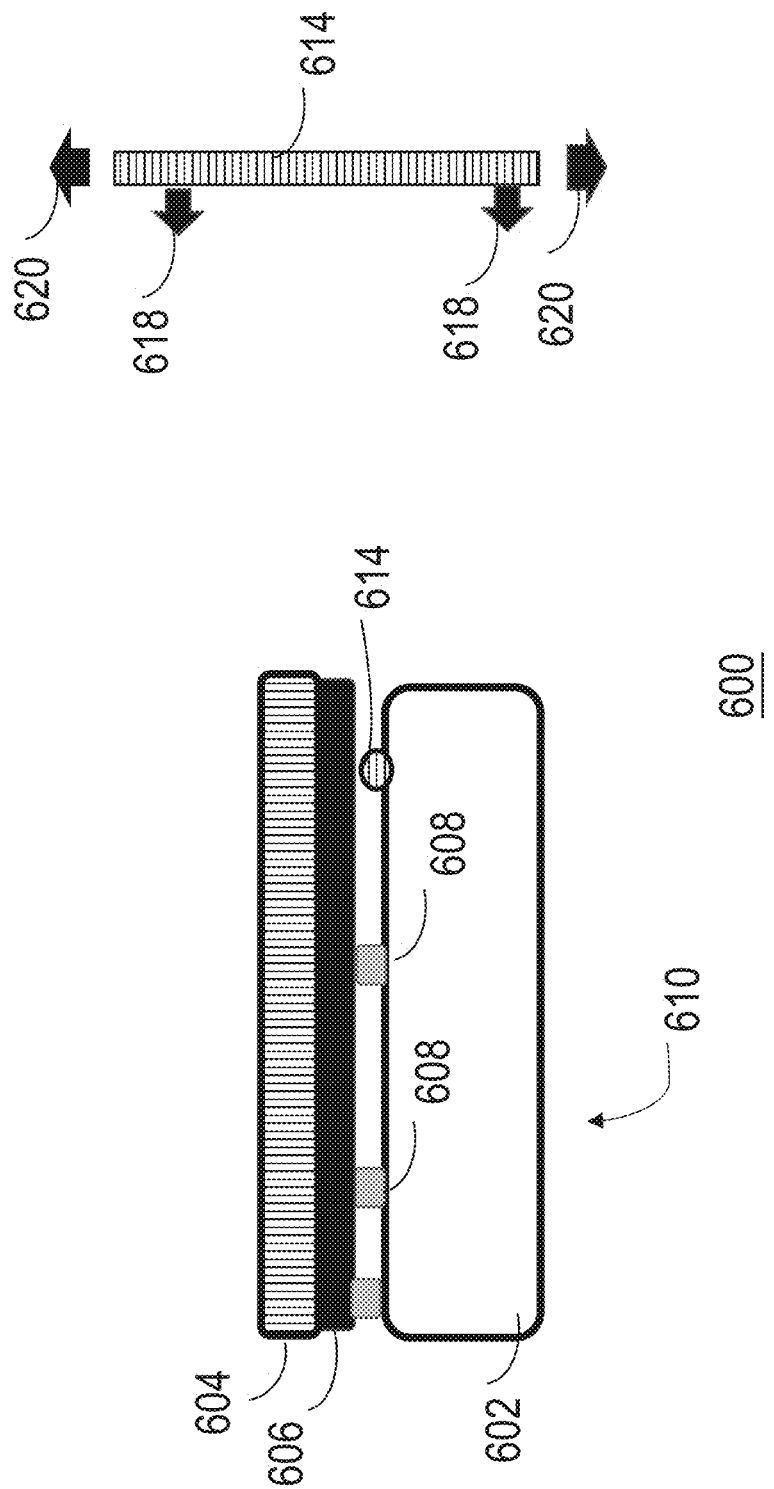
FIG. 6 shows cross-sectional and top views of one embodiment of the disclosure.

FIG. 6 shows cross-sectional and top views, respectively, of a debonding technique 600 according to one embodiment of the present disclosure. As shown, the carrier 602 is bonded to a workpiece 604 with an adhesive material 606 to form a temporary bonding stack 610. Optionally, an additional adhesive 608 may also be included in the bonding stack 610 that is laser decomposable to facilitate the debonding process. In operation, an external component such as a thin subject 614 may be brought into direct physical contact with the adhesive material 606 to facilitate separation of the workpiece 604 from the carrier 602. The thin subject 614 can apply wedge force or shear force to the debonding interface between the adhesive material 606 and a substrate, whether it be the workpiece 604 or the carrier 602. In some embodiments, the thin subject 614 may directly contact only the adhesive material 606, only the additional adhesive 608, or both materials 606, 608. Optionally, a laser device (not shown) similar in operation to that shown in FIG. 3 may be incorporated to further facilitate the debonding process. The laser device may subject the adhesive material 606 or the additional adhesive 608 to electromagnetic energy to further debond or dissolve the material for separation of the carrier 602 and the workpiece 604. As shown in the top view, the thin subject 614 may be moved across the temporary bonding stack 610 along X and Y directions as shown by the arrows 618 and 620, respectively. In some embodiments, the movements of the thin subject 614 may be in a reciprocating saw-like motion during its application.

Figure 7:
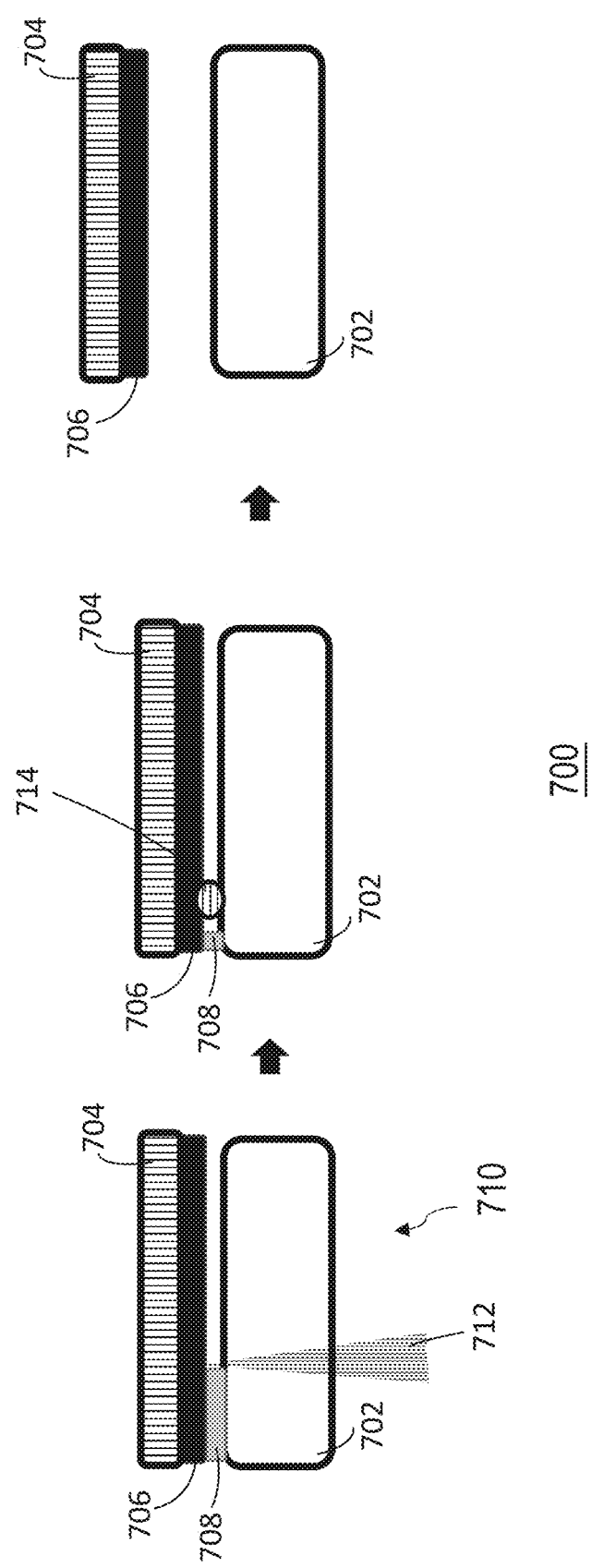
FIG. 7 shows in cross-sectional views of the processing steps according to one embodiment of applying a thin subject device to remove residues.

FIG. 7 shows cross-sectional views of a debonding process flow 700 according to one embodiment of the present disclosure of using thin subject to solve problems associated with laser debonding technique. As shown, the carrier 702 is bonded to a workpiece 704 with an adhesive material 706 to form a temporary bonding stack 710. Optionally, an additional adhesive 708 may also be included in the bonding stack 710 that is laser decomposable to facilitate the debonding process. In operation, an external component such as a thin subject 714 may be brought into direct physical contact with the adhesive material 706 to facilitate separation of the workpiece 704 from the carrier 702. The thin subject 714 can apply wedge force or shear force to the debonding interface between the adhesive material 706 and a substrate, whether it be the workpiece 704 or the carrier 702. In some embodiments, the thin subject 714 may directly contact only the adhesive material 706, only the additional adhesive 708, or both materials 706, 708. Like before, the movements of the thin subject 714 may be in a reciprocating saw-like motion during its application. As the thin subject 714 is brought across the bonding stack 710, the workpiece 704 can be separated from the carrier 702. Although the adhesive material 706 is shown to be coupled to the workpiece 704, the adhesive material 706 may be removed by the thin subject 714 and/or by subsequent processing techniques.

Figure 8:
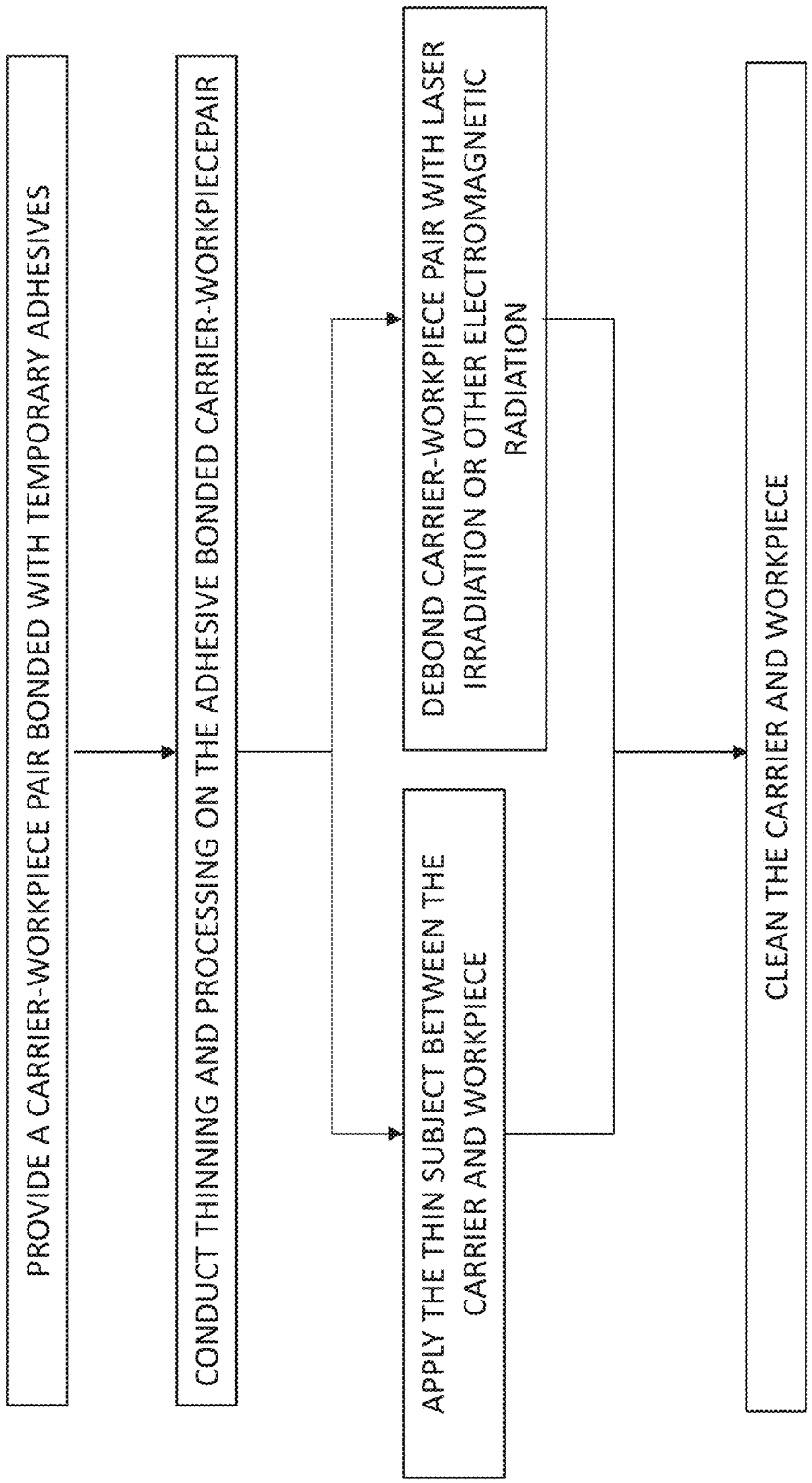
FIG. 8 is a flow diagram illustrating the processing steps in one embodiment of using a thin subject device.

FIG. 8 is a flow diagram illustrating steps in one embodiment of using thin subject 714 to solve problems associated with the laser debonding method. In operation, the process starts with providing a carrier-workpiece pair with temporary adhesives 710. Optionally, the adhesive bonded carrier-workpiece pair can be thinned and processed. In one embodiment, the thin subject 714 can be applied between the carrier and the workpiece as shown in FIG. 7. Concomitant to the applying step of the thin subject 714, the carrier-workpiece can be debonded with laser irradiation or other electromagnetic radiation techniques. In one embodiment, the debonding process can be carried out with the thin subject 714 by itself. In another embodiment, the debonding process can be carried out with the thin subject 714 in conjunction with known laser debonding techniques. In this embodiment, the two steps can be carried out concomitantly, in a reciprocating saw-like motion as discussed above, to further facilitate the debonding process. The carrier 702 and the workpiece 704 may subsequently be cleaned by known techniques to complete the debonding process. In some embodiments, the force applied by the thin subject 714 may further dissociate residues leftover by adhesive components 706, 708.

FIGS. 7 and 8 schematically demonstrate the method of introducing a thin subject to facilitate laser debonding or electromagnetic irradiation debonding. In laser debonding or electromagnetic irradiation debonding, the thin subject can be inserted at a time that it does not interfere with the laser ablation. The thin subject can be applied after the laser ablation scanning, or following the laser ablation, in a timely sequence.

In one embodiment, a method of manufacturing a semiconductor device includes: providing a first substrate bonded to a second substrate having an adhesive material therebetween, where the first substrate includes at least one integrated circuit disposed thereon; applying a mechanical force to the at least one of the first substrate and the second substrate in a substantially vertical orientation; and concomitant to the applying step, actuating an external device into direct physical contact with the adhesive layer along a substantially horizontal orientation to facilitate separation of the first substrate from the second substrate. In another embodiment, the method further includes: exposing the first substrate and the second substrate to a chemical solvent further operable to dissolving the adhesive material.

In some embodiments, the separating step includes actuating the external device in the form of a blade or a wire in a reciprocating saw motion, where the blade or the wire is made of at least one of ceramic, metal, metal composite, metal coated polymer, metal alloy, synthetic or natural polymer, or polymer composite. In other embodiments, the separating step includes actuating the external device in the form of a blade or a wire in a reciprocating saw motion, where the blade or the wire has triangular, circular, oval, rectangular, or square cross-section profile transverse the wire or the blade. In some embodiments, the separating step includes actuating the external device in the form of a blade or a wire in a reciprocating saw motion, wherein the blade or the wire has saw-tooth shaped cross-section profile along at least a portion of the wire or the blade.

In one embodiment, a method of manufacturing a semiconductor device includes: providing a first substrate bonded to a second substrate having an adhesive material therebetween, where the first substrate includes at least one integrated circuit disposed thereon; applying an electromagnetic force to the at least one of the first substrate, the second substrate, and the adhesive layer; and concomitant to the applying step, actuating an external device into direct physical contact with the adhesive layer along a substantially horizontal orientation to facilitate separation of the first substrate from the second substrate. In another embodiment, the method further includes: exposing the first substrate and the second substrate to a chemical solvent further operable to dissolving the adhesive material.

In some embodiments, the separating step includes actuating the external device in the form of a blade or a wire in a reciprocating saw motion, where the blade or the wire is made of at least one of ceramic, metal, metal composite, metal coated polymer, metal alloy, synthetic or natural polymer, or polymer composite. In other embodiments, the separating step includes actuating the external device in the form of a blade or a wire in a reciprocating saw motion, where the blade or the wire has triangular, circular, oval, rectangular, or square cross-section profile transverse the wire or the blade. In some embodiments, the separating step includes actuating the external device in the form of a blade or a wire in a reciprocating saw motion, wherein the blade or the wire has saw-tooth shaped cross-section profile along at least a portion of the wire or the blade.

Figure 9:
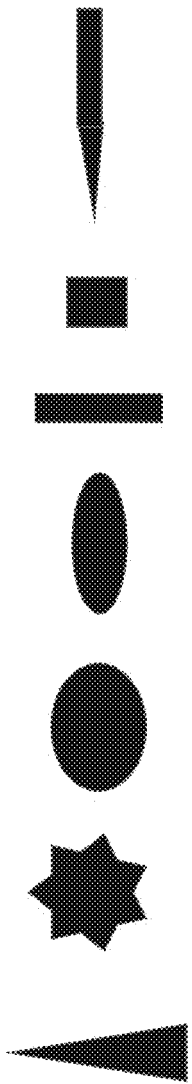
FIG. 9 shows cross-sectional views of several embodiments of the thin subjects in this disclosure.
Figure 10:
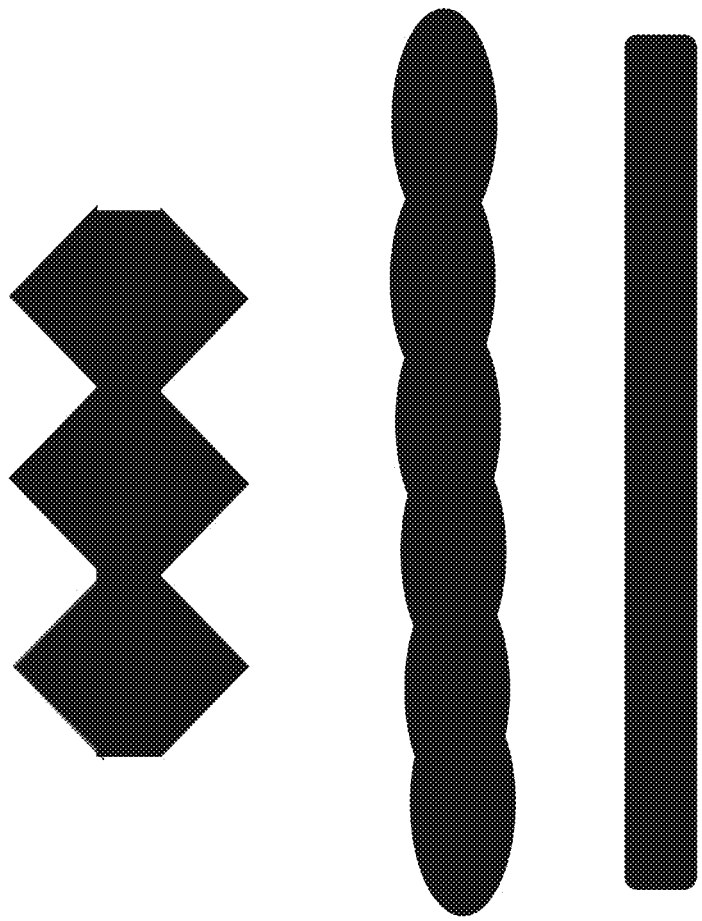
FIG. 10 shows longitudinal views of several embodiments of the thin subjects in this disclosure.

FIG. 9 shows in cross-sectional views some of the embodiments of the thin subjects in this disclosure. FIG. 10 shows in longitudinal views some of the embodiments of the thin subjects in this disclosure.

FIGS. 9 and 10 schematically demonstrate the example shapes of wires, filaments, blades from cross sectional angle. It should be understood that any shape can be used so long they give cutting or wedging action to detaching adhesive to substrate interface in the case of mechanical debonding and the releasing layer or the adhesive material that has been ablated in laser debonding. The thin subjects, 414 in FIG. 4, 614 in FIG. 6, and 714 in FIG. 7, in the form of thin wire, or thin filament, or thin blade, can be of varied cross-sectional areas along their length, such as saw shapes.

In the embodiments disclosed herein, the carrier 402, 602, 702 can be of the same material as the workpiece 404, 604, 704 of device wafer that has enough mechanical strength. In semiconductor wafer bonding and debonding processes, the carrier 402, 602, 702, can be made of silicon, glass, quartz, among other materials.

The workpiece 404, 604, 704, also known as device wafer, can be optical lens, quartz, sapphire wafers, display glass, LED crystal, thin metal plate, thin membrane, film, among other materials. In some embodiments, the workpiece 404, 604, 704 can be made of silicon, polysilicon, silicon oxide, silicon-germanium, silicon nitride, gallium arsenide, gallium nitride, gallium phosphide, alumina titanium carbide, silicon carbon, among others. In other embodiments, the workpiece 404, 604, 704 can be metals such as copper, aluminum, steel, gold, tungsten, tantalum, low-K dielectrics, metal nitrides, metal alloys, silicides, or any combination thereof.

The external device, also known as the thin subject 414, 614, 714, can be used to eliminate problems which are detrimental in mechanical debonding or laser debonding. This thin subject 414, 614, 714 can be inserted between the adhesive 406, 606, 706 and its debonding substrate, carrier 402, 602, 702 or device wafer 404, 604, 704, applies to all the adhesives that are suited for mechanical or laser debonding. The adhesives 406, 606, 706 and or their releasing layers 608, 708 can be polyimides, triazine-polymers, rubbers, cyclic olefins, polyacrylates, poly methyl methacrylate, polyurethanes, polycarbonates, polyethylene terephthalate, cellulose, polyesters, polystyrences, epoxies, silicones, polyamides, polysulfones, or combinations thereof, among other materials. The adhesives 406, 606, 706 can also be of formulations which use polymers as binders and may also contain fillers and additives such as antioxidants or plasticizers, among others.

In some embodiments, the thin subject 414, 614, 714 can be in the form of thin wire, or thin filament, or thin blade, or thin saw shape, of varied cross-sectional areas, or combination thereof, among other polygonal shapes and figures. These components have to be relatively thin, so they do not cause mechanical damage to the device wafer 404, 604, 704 or carrier 402, 602, 702 during debonding. The wire, filament, or blade 414, 614, 714 can be made of synthetic polymers, natural polymers, metals, ceramics, or combinations thereof, among other materials. An example of the thin wire is a floss made of polymers. An example of combination is metal wire or blade coated with polymers. In some embodiments, the wires, filaments, or blades can be made of copper, gold, silver, stainless steel, tungsten, among other materials. The thickness of the wire, the filament, or the blade may be less than about 10 mm, or less than about 5 mm, or less than about 3 mm, or less than about 2 mm, or less than about 1 mm, among other suitable dimensions. In some embodiments, the thin subject 414, 614, 714, being wire, filament, or blade, may have their outer surfaces made of polymers so to avoid scratch or damage the carrier wafer or device wafer surfaces during mechanical movement. In other embodiments, the thin subjects 414, 614, 714 may be lubricated or self-lubricating. For example, thin subject of wire or blade made of fluorinated materials, silicones, polyolefins can be of low surface energy and thus offer lubricating function. Examples of polymer wires include dental floss or filaments made of polyamide, elastic synthetic polymer based on aliphatic or semi-aromatic polyamides, polytetrafluoroethylene (PTFE), synthetic fluoropolymer of tetrafluoroethylene, among other suitable polymers. In other embodiments, the wires, filaments, and blades can be made of other polymers such as polypropylene, silk, cotton, and other fluorinated polymers. Filament can be viewed as a special wire of single thread.

The polymeric adhesives 406, 606, 706 can be applied to the wafers or workpieces 404, 604, 704 using spin coating, spray coating, slot coating, knife coating, and other available coating techniques from solutions. The polymeric adhesives 406, 606, 706 can also be applied in dry film lamination. The adhesives 406, 606, 706 should form as uniform films as possible. Bonding of device wafer 404, 604, 704 to carrier wafer 402, 602, 702 coated with adhesives 406, 606, 706 can be accomplished in suitable bonding machines.

The adhesive bonded device wafer stack 410, 610, 710 with the support of carrier wafer can safely be subjected to thinning such as back-grinding and chemical-mechanical polishing (CMP). After thinning, other backside processing can be carried out too, such as TSV-formation, etching such as DRIE, metal and dielectric deposition, patterning (e.g., photolithography, via etching), plasma ash, bonding pads, passivating, annealing, and any combinations thereof. After these processes, the wafer device wafer stack 410, 610, 710 is ready to be debonded or separated from the carrier wafer and cleaned of the adhesive.

As shown in FIGS. 4 and 6, the thin subjects (wire, filament, blade or razor), should move in directions 418, 420, 618, 620 across the surface of either carrier or device wafer that the adhesive is detaching from in the case of mechanical debonding, or along the releasing layer (between the adhesive layer and the carrier) in the case of laser debonding. The thin subject 414, 614, 714 should apply the cutting or wedging type of action to facilitate mechanical and laser debonding and remove any possible residues by mechanical or laser debonding. In other words, the thin subject 414, 614, 714 is applied to apply mostly shear force the debonding process. The thin subject insertion method to remove residues or defects caused by mechanical or laser debonding action is illustrated by the schematic flow diagrams of FIGS. 5 and 8.

In operation and in reference to FIGS. 6-8, the adhesive 606, 706 and its release layer 608, 708 bonded carrier wafer and device wafer pair 610, 710 is exposed to laser 712 in scanning mode. The thin subject 614, 714, a thin wire or blade, can be held at two ends aimed at the releasing layer 608, 708 that has been ablated by the laser 712 as best illustrated in FIG. 7. Concomitant to the laser ablation, the thin wire or blade 614, 714 is applied in a reciprocating sawing mode to remove any residues that may remain. In doing so the thin subject 614, 714 greatly increases the debonding speed and remove residual defects. These examples demonstrate how the thin subject 614, 714 can be inserted to facilitate laser debonding and solve the problems caused by the laser debonding.

In operation, the thin subject 414, 614, 714 is able to apply shear force uniformly to the adhesive debonding line. The thin subject 414, 614, 714 movement can follow the pattern of peeling and pulling in instances of mechanical debonding. The force of peeling can vary depending in accordance with the wedge effect of the thin subject 414, 614, 714. In some embodiments, the mechanical force of peeling and pulling to be applied during mechanical debonding can be reduced with the assistance of the thin subject 414, 614, 714. In other embodiments, the mechanical force of peeling and pulling to be applied during mechanical debonding can be zero. In other words, no peeling or pulling forces are needed if the thin subject 414, 614, 714 applies sufficient shear forces to the debonding process.

In laser debonding, the thin subject can have a larger selection of movement patterns to facilitate the debonding process. The total area that will be exposed to laser debonding can also vary as a result of the thin subject application. For example, the laser scanned area can be much smaller with the application of thin subject than that with no application of the thin subject.

Lubricants can also be applied to the thin subject or introduced to the debonding locations to help reduce friction and reduce localized heating. The lubricants can be inert to the adhesive to not cause adhesive to deform in unfavorable way. Common lubricants can be used if they are clean and do not contaminate the device wafer. For example, water or glycerol-based lubricants can be used. Some solvents such as NMP, PGMEA, alcohol, plasticizers, surfactants, hydrocarbons, silicone oil, fluorinated solvents, can be used to help reduce the thin subject surface friction force and eliminating localized heating if the adhesive is not soluble in the solvents.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of manufacturing a semiconductor device, comprising:
    providing a first substrate bonded to a second substrate by an adhesive material forming an adhesive layer therebetween, wherein the first substrate includes a semiconductor wafer workpiece with at least one integrated circuit disposed on a surface thereof, wherein the adhesive layer comprises a laser decomposable layer;
    applying an electromagnetic energy to the laser decomposable layer to decompose the laser decomposable layer; and
    while applying the electromagnetic energy, actuating an external device into direct physical contact with the entire adhesive layer along a direction substantially parallel to the surface of the first substrate and concomitantly moving the external device in a reciprocating saw-like motion to facilitate separation of the first substrate from the second substrate,
    wherein the external device is a polymer wire having a thickness of less than 1 mm.

2. The method of claim 1, further comprising:
    exposing the first substrate and the second substrate to a chemical solvent operable to dissolve the adhesive material.

3. The method of claim 1, wherein the polymer wire includes a transverse section having at least one of a triangular, circular, oval, rectangular, and square shape.

4. The method of claim 1, wherein the polymer wire includes a transverse section having a saw-tooth shape.

5. The method of claim 1, wherein the polymer wire includes a dental floss.

* * * * *